United States Patent
Kouno et al.

(10) Patent No.: US 6,670,201 B2
(45) Date of Patent: Dec. 30, 2003

(54) MANUFACTURING METHOD OF SEMICONDUCTOR DEVICE

(75) Inventors: Masaki Kouno, Ome (JP); Masato Hamamoto, Iruma (JP); Atsushi Wakahara, Ome (JP); Hideyuki Takahashi, Hamura (JP); Keiichi Higeta, Hamura (JP); Mitsugu Kusunoki, Kunitachi (JP); Kazutaka Mori, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/939,670

(22) Filed: Aug. 28, 2001

(65) Prior Publication Data

US 2002/0036534 A1 Mar. 28, 2002

(30) Foreign Application Priority Data

Sep. 28, 2000 (JP) ........................................ 2000-296016

(51) Int. Cl.[7] ........................... G01R 31/26; H01L 21/66
(52) U.S. Cl. .............................. 438/14; 438/11; 438/18; 438/197; 438/199; 257/48; 324/500; 324/525; 326/45; 326/49; 326/62; 326/68; 326/81
(58) Field of Search ................................ 438/14, 11, 18, 438/15, 197, 199; 257/48; 324/500, 525; 326/83, 46, 81, 45, 47–50, 62–80

(56) References Cited

U.S. PATENT DOCUMENTS 5,486,777 A * 1/1996 Nguyen ........................ 326/68
5,510,943 A * 4/1996 Fukunaga ..................... 361/18
5,646,548 A * 7/1997 Yao et al. ...................... 326/80
5,739,716 A * 4/1998 Kwak ........................ 327/427
5,761,463 A * 6/1998 Allen ......................... 395/309
6,323,706 B1 * 11/2001 Stark et al. ................. 327/175

FOREIGN PATENT DOCUMENTS

JP          10-104313          4/1998

OTHER PUBLICATIONS

"The International Technology Roadmap for Semiconductors," pp. 5 and 6 (1999).
Chang et al., "Experimental Results for IDDQ and VLV Testing," IEEE, pp. 118–123 (1998).

* cited by examiner

Primary Examiner—Matthew Smith
Assistant Examiner—Granvill D Lee, Jr.
(74) Attorney, Agent, or Firm—Miles & Stockbridge P.C.

(57) ABSTRACT

A manufacturing method of a semiconductor device capable of obtaining highly reliable semiconductor devices with the realization of high integration and high speed intended is provided. During processes after a desired circuit including a CMOS static type circuit is formed on a semiconductor substrate until product shipment, a first operation of feeding a predetermined input signal to the circuit and retrieving a first output signal corresponding to it and a second operation of giving an operating condition of increasing an ON resistance value of MOSFETs constituting the CMOS static type circuit and retrieving a second output signal corresponding to the condition are conducted, and a testing step of determining a failure by the first output signal varying from the second output signal.

17 Claims, 8 Drawing Sheets

WHEN TESTING SEN=1, SFCNTL=1

WHEN TESTING SEN=0, SFCNTL=1

MANUFACTURING METHOD OF SEMICONDUCTOR DEVICE

BACKGROUND OF THE INVENTION

The present invention relates to a manufacturing method of a semiconductor device.

A survey done after the invention had been made reported to the inventors the existence of inventions described in *The International Technology Roadmap for Semiconductors*, pp. 5 to 6 (1999) (hereafter, it is referred to as related art 1), IEEE, pp. 118 to 123 (1998) (hereafter, it is referred to as related art 2), and Japanese patent Laid-Open No. 104313/1998 (hereafter, it is referred to as related art 3).

The related art 1 abstractedly describes that it will be needed to provide a current seneor, to divide a power supply or to control back bias because the determination of good items/detectives by the IDD quiescent test is expected to be difficult due to an increase in leakage current associated with the realization of high integration. The related art 2 describes the IDD quiescent test and the low voltage test. The related art 3 describes a semiconductor integrated circuit where the output of a random pattern generator is inputted from a latch to a combinational circuit and the exclusive OR of the output is tested. However, the idea such that the leakage current in a CMOS static type circuit is detected by circuit operations or that is applied to the semiconductor device fabrication, as similar to the invention described later, is seen in none of the related arts 1 to 3.

SUMMARY OF THE INVENTION

Because of the progress in semiconductor technologies, when an MOSFET is formed to have a low threshold voltage for the realization of down-scaling or speeding devices, or a circuit scale is increased to form many elements, an occupied ratio of the leakage current, which is referred to as a threshold leakage current flowing through a source-to-drain path of the MOSFET in the OFF state or tailing, is increased in a direct current IDD quiescent flowing between a power supply tenninal and an earthing terminal of the semiconductor device, as associated with that. Thus, the determination of good items/defectives by the IDD quiescent test becomes difficult as described above. Then, the inventors considered finding those closely related to circuit operation failures in the leakage current by utilizing the circuit operations, instead of measuring a current itself in the past.

The purpose of the invention is to provide a manufacturing method of a semiconductor device capable of obtaining highly reliable semiconductor devices with the realization of high integration and high speed intended and a testing method of a semiconductor device. The aforementioned and other purposes and novel features of the invention will be apparent from the description of the specification and the accompanying drawings.

A summary of a representative invention among the inventions disclosed in the application will be described briefly as follows. During processes after a desired circuit including a CMOS static type circuit is formed on a semiconductor substrate until product shipment, a first operation of feeding a predetermined input signal to the circuit and retrieving a first output signal corresponding to it and a second operation of giving an operating condition of increasing an ON resistance value of MOSFETs constituting the CMOS static type circuit and retrieving a second output signal corresponding to the condition are conducted, and a testing step of determining a failure by the first output signal varying from the second signal is provided.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

Figure 1:
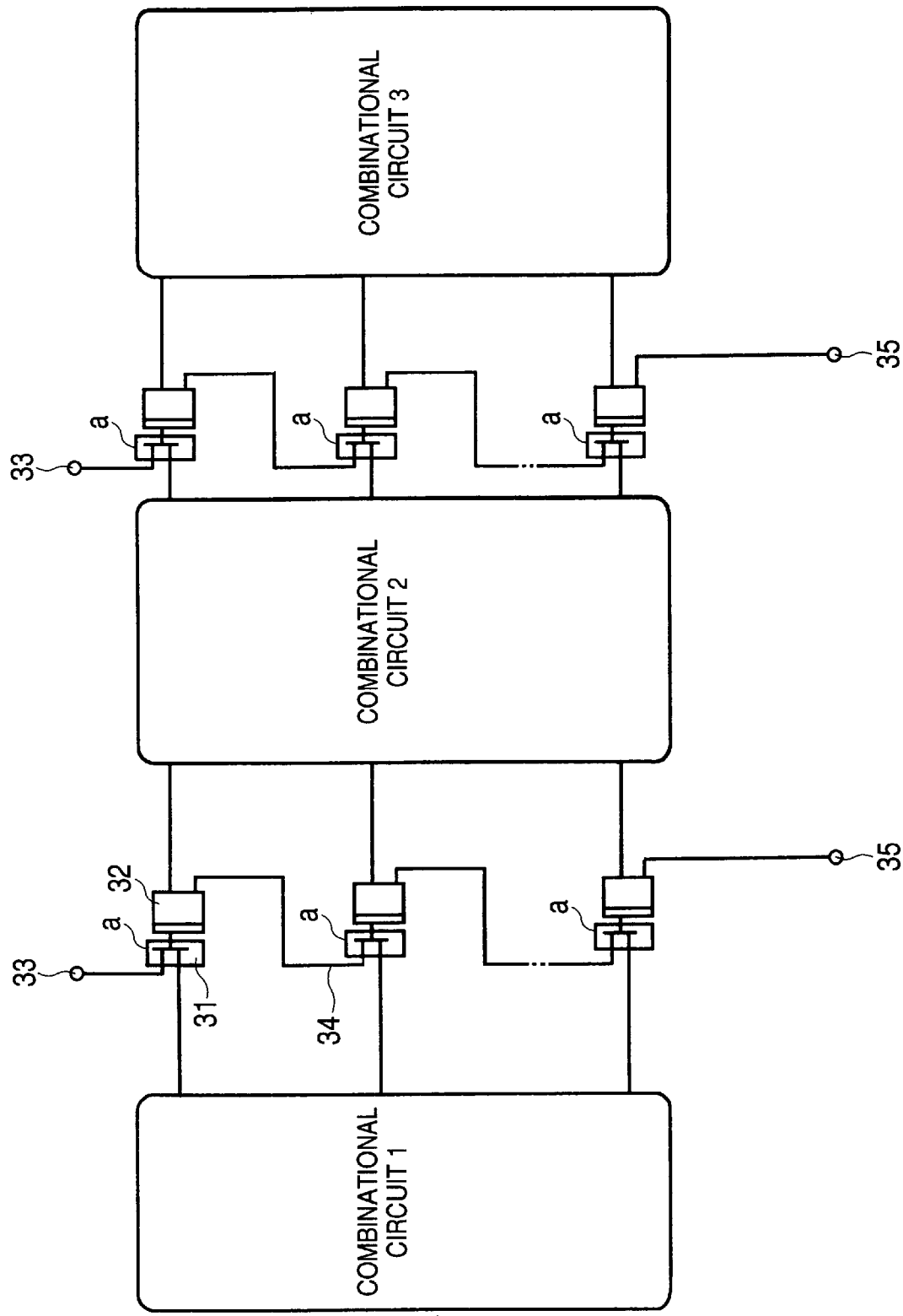
FIG. 1 depicts a schematic block diagram illustrating one embodiment of a semiconductor device applied to the manufacturing method of the semiconductor device in the invention.

FIG. 1 depicts a schematic diagram illustrating one embodiment of a semiconductor device applied to the manufacturing method of the semiconductor device in the invention. The semiconductor device of the embodiment incorporates testing circuits by the scan path or shift scanning method. Clocks fed to flip-flop circuits 32 for constituting the scan path are omitted.

In the testing operation, a control signal a of a selector 31 is set on the shift chain 34 side and a test pattern is serially fed from a shift chain input terminal 33 to allow each of the flip-flop circuits to hold test pattern signals. After that, the control signal a is switched to the combinational circuits 1 and 2 sides to apply clocks to the flip-flop circuits 32 and the output values of combinational circuits 1 and 2 are taken in the respective corresponding flip-flop circuits 32. Then, the control signal a is set on the shift chain 34 side to apply clocks and test results are retrieved from a shift chain output terminal 35 to compare them with the expected value for determining the acceptability.

The testing circuits described above are exclusively used for verifying the logical operation of the combinational circuits 1 and 2. In the invention, such testing circuits by the scan path or shift scanning method are contrived for use in the direct current testing as well, in other words, the leakage testing, equivalently and substantially.

Figure 2A:
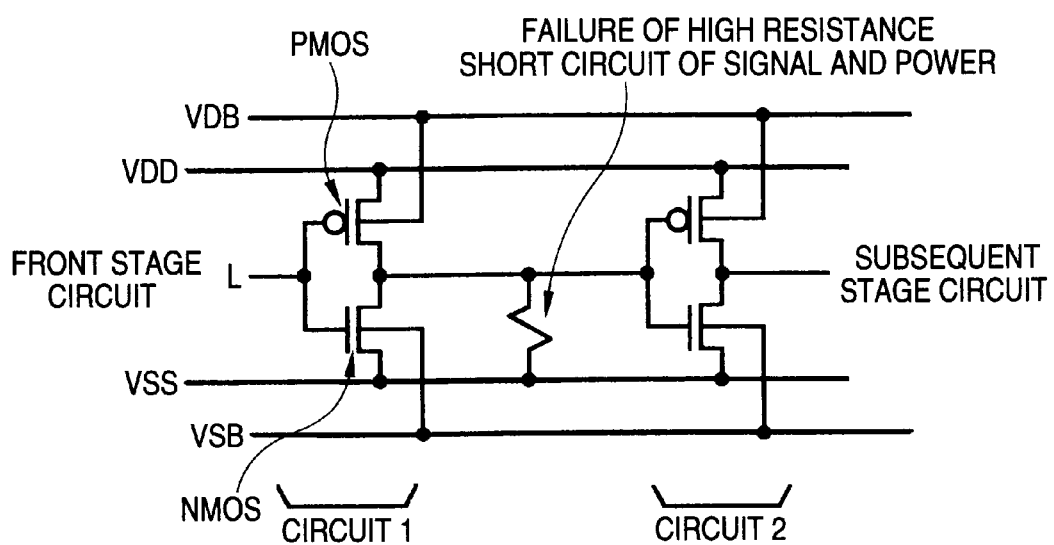
FIGS. 2A and 2B depict circuit diagrams for illustrating a principle of the testing method in the invention.
Figure 2B:
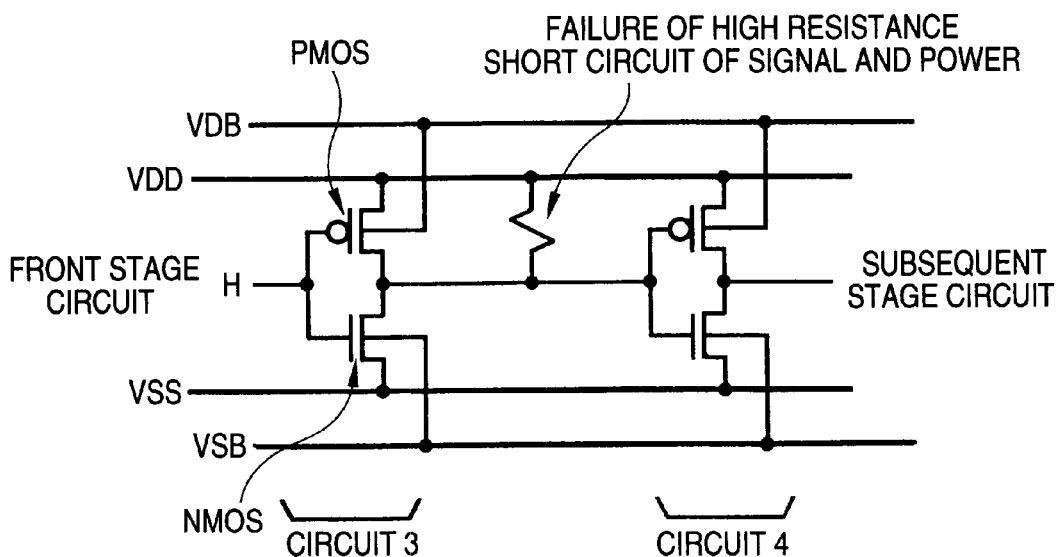

FIGS. 2A and 2B depict circuit diagrams for illustrating a principle of the testing method for use in the manufacturing method of the semiconductor device in the invention. In circuits 1 and 2 made of a CMOS inverter circuit constituted of an N-channel type MOSFET (hereafter, it is simply referred to as NMOS) and a P-channel type MOSFET (hereafter, it is simply referred to as PMOS) in FIG. 2A, when a high resistance short circuit failure is generated between the output terminal of the circuit 1 and an earth potential VSS of a signal path circuit to the input terminal of the circuit 2, the combinational circuits are operated normally even though the testing operation by the previous scan path or shift chain method is conducted.

That is, when the input of the circuit 1 is at a low level (L) and a wiring path connecting the output terminal of the circuit 1 to the input terminal of the circuit 2 is short-circuited at high resistance with the VSS power supply in FIG. 2A, the potential of the failed signal path is determined by a ratio of ON resistance of the PMOS of the circuit 1 to short-circuited resistance. When the short-circuited resistance value is equal to or smaller than the ON resistance value of the PMOS, the output signal does not reach the logic threshold voltage of the circuit 2 to output an output signal at a high level (H) from the circuit 2, even though an input signal to be fed to the gate of the PMOS of the circuit 1 becomes at a low level (L). Such a malfunction can be detected by a logic testing by the scan path method.

On the other hand, the leakage current failure that the invention is to detect is the case where the short-circuited resistance value is sufficiently greater with respect to the ON resistance value of the PMOS, in which the output signal of the circuit 1 becomes at a high level and the circuit 2 is operated normally to turn the output at a low level (L). Because of this, the leakage current failure mentioned above cannot be detected by the operation testing by the scan path method described above. Then, when the semiconductor device has only one or a few points where the leakage current failures are generated, even the previous IDD quiescent test cannot detect them in many cases; even though they can be detected, it is impossible to locate the points where the leakage current failures are generated.

In order to detect the leakage current failure itself and the point where the leakage current failure is generated, the inventors considered controlling the ON resistance of the PMOS from outside, that is, setting the operating condition increases the ON resistance value of the PMOS to have the value equal to or greater than the short-circuited resistance value. Such an operating condition is given and thereby the ON resistance value of the PMOS becomes greater. The output signal of the circuit 1 is made to have an intermediate potential in accordance with the ratio of the resistance value of the PMOS ON resistance and the short-circuited resistance. When it is turned to be lower than the logic threshold voltage of the circuit 2, the output signal of the circuit 2 is inverted from a low to a high level. Such change to a high level is detected and thereby the leakage current failure can be determined.

As a method for controlling the PMOS ON resistance, when a mechanism for controlling a substrate bias voltage VDB of the PMOS, that is, a substrate back bias circuit exists, the PMOS ON resistance can be increased in case where the substrate bias voltage VDB is controlled to be VDD<VDB. Additionally, in the semiconductor device having no mechanism for controlling the substrate bias voltage VDB, dropping the supply voltage VDD can decrease a gate-to-source voltage VGS (=VDD) and thus the ON resistance can be increased. However, it is dropped up to the marginal voltage that circuits operate normally.

In the semiconductor device having the substrate back bias circuit, it is possible to control both the substrate bias voltage VDB and the supply voltage VDD to be measured. When both the voltages VDB and VDD can be controlled, the ON resistance value of the PMOS can be increased further, even though it has the same leakage resistance value, and thus failures can be detected easily.

In FIG. 2B, when a high resistance short circuit failure is generated between the output terminal of a circuit 3 and a supply voltage VDD of a signal path circuit to the input terminal of a circuit 4 in the circuits 3 and 4, combinational circuits happen to operate normally even though the testing operation by the previous scan path or shift chain method is conducted. That is, the leakage current failure that the invention is to detect is the case where the short-circuited resistance value is sufficiently greater with respect to the ON resistance value of the NMOS, in which an output signal is turned at a low level when an input signal at a high level (H) is fed to the circuit 3 and the circuit 2 operates normally to turn the output at a high level (H). Because of this, the leakage current failure described above cannot be detected by the operation test by the scan path method mentioned above.

In this case, in order to detect the leakage current failure mentioned above, the NMOS ON resistance is also controlled from outside, that is, setting operating condition increases the ON resistance value of the NMOS to have the value equal to or greater than the short-circuited resistance value. Such an operating condition is given and thus the ON resistance value of the NMOS becomes greater. The output signal of the circuit 3 becomes an intermediate potential in accordance with the ratio of the resistance value of the NMOS ON resistance and the short-circuited resistance. When it is turned higher than the logic threshold voltage of the circuit 4, the output signal of the circuit 4 is inverted from a high to a low level. Such change to a high level is detected and thereby the leakage current failure can be determined.

As a method for controlling the NMOS ON resistance, when a mechanism for controlling a substrate bias voltage VSB of the NMOS, that is, a substrate back bias circuit exists, the NMOS ON resistance can be increased in case where the substrate bias voltage VSB is controlled to be VSB<VSS. Additionally, in the semiconductor device having no mechanism for controlling the substrate bias voltage VSB, dropping the supply voltage VDD can decrease a gate-to-source voltage VGS (=VDD) and thus the ON resistance can be increased. It is possible to control both the substrate bias voltage VDB and the supply voltage VDD to be measured. When both the voltages VDB and VDD can be controlled, the ON resistance value of the PMOS can be increased further, even though it has the same leakage resistance value, and thus failures can be detected easily.

In FIG. 1, as similar to the aforesaid normal testing operation, a test pattern is inputted and the output signal corresponding to that is scanned out and retrieved. As the test pattern remains as it is, the supply voltage VDD is dropped to the lower limit operating voltage of the combinational circuits, or the substrate back bias voltage is controlled to increase its absolute value in addition to this. In this state, the change in the logical signals in the combinational circuits 1 and 2 is taken in the flip-flop circuits and the results are serially outputted and retrieved. Then, the output pattern is compared with the output pattern retrieved by the operation in the normal operating conditions. When the signal is changed in the output pattern, the leakage current failure and the position where it is generated are determined as the position where the flip-flop circuit is disposed.

Figure 3:
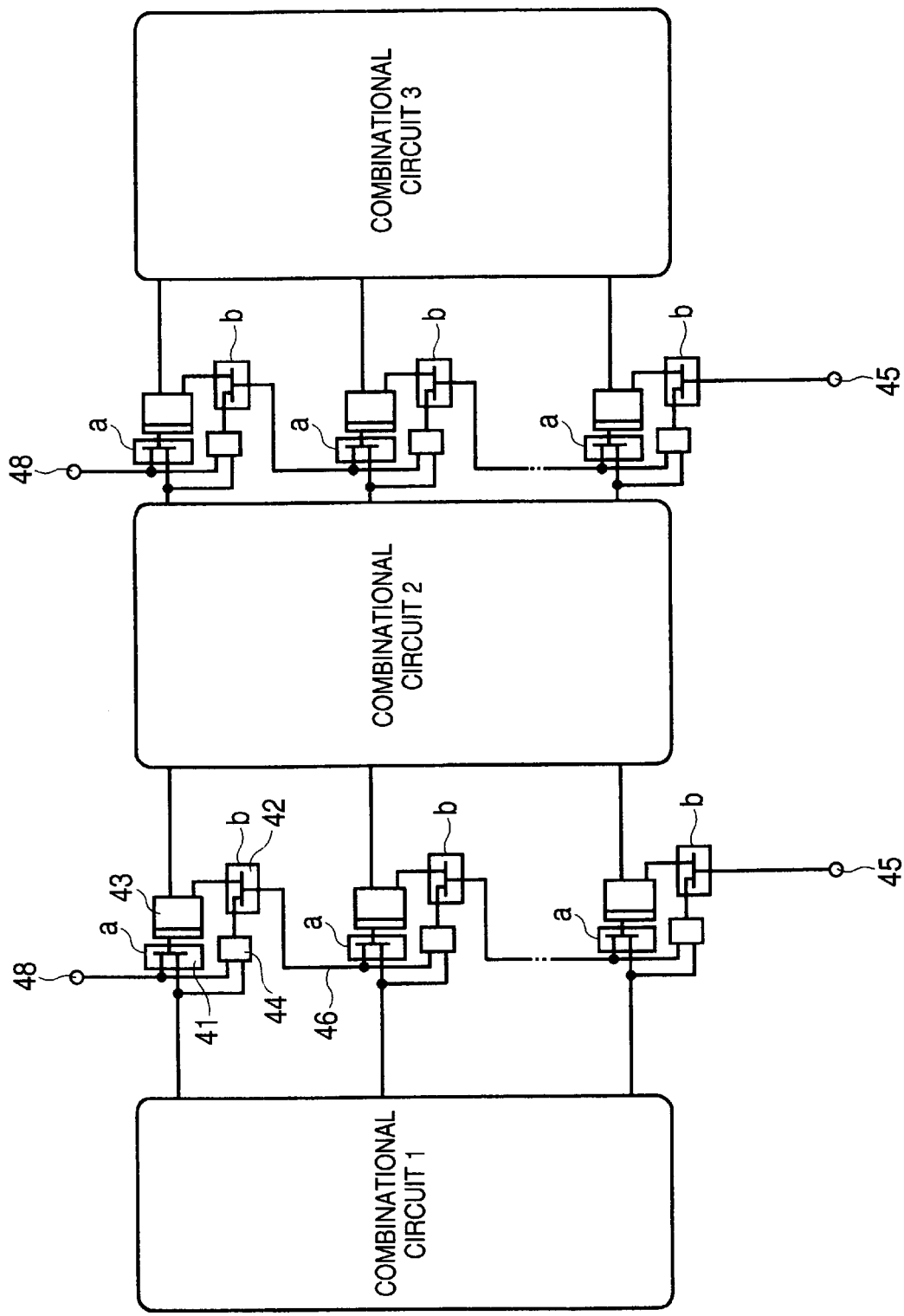
FIG. 3 depicts a schematic block diagram illustrating another embodiment of the semiconductor device applied to the manufacturing method of the semiconductor device in the invention.

FIG. 3 depicts a schematic diagram illustrating another embodiment of the semiconductor device applied to the manufacturing method of the semiconductor device in the invention. The semiconductor device of the embodiment incorporates testing circuits by the scan path method as described above. Flip-flop circuits 43 are provided with selectors 41 and 42 in the input part and the output part, respectively. Then, a coincidence/non-coincidence circuit 44 such as an exclusive-OR circuit (EOR) that receives signals outputted from the combinational circuit 1 and output signals from a front stage circuit serially connected to constitute a shift chain 46 (scan path) is disposed. In the same drawing, clocks fed to the flip-flop circuits 43 are omitted.

The embodiment is configured in which failure information due to the leakage resistance caused by the combinational circuits 1 and 2 as described above is not taken in the flip-flop circuit, which is transmitted to the shift chain 46. That is, the difference from the embodiment shown in FIG. 1 is in that the circuit 44 constituted of the EOR for detecting coincidence/non-coincidence between the failure information of the combinational circuits 1 and 2 and the front stage output of the shift chain and a selector 42 for selecting the coincidence/non-coincidence result and scanned out data of the flip-flop circuit are added.

When the functions of the combinational circuits 1 and 2 are tested, the testing operation is conducted by repeating an operation in which a control signal b of the selector 42 is set on the scan out side of the flip-flop circuit, a control signal a of the selector 41 at the front stage of the flip-flop circuit is controlled to apply the scan pattern, the test pattern is serially taken in and test results are serially outputted and retrieved, in a normal testing operation.

In the embodiment, as similar to the normal testing operation described above, a test pattern is inputted and the corresponding output signal is scanned out and retrieved. With this test pattern inputted, the supply voltage is dropped to the lower limit operating voltage of the circuits, or the substrate back bias voltage is controlled to increase its absolute value in addition to this. In this state, the change in the logical signals of the combinational circuits 1 and 2 are taken in the flip-flop circuits and the results are serially outputted and retrieved. When the signal is changed in the output as compared with the previous outputs, the leakage current failure and the position where it is generated are determined as the position where the flip-flop circuit is disposed.

In the embodiment, the method in which failure information of the combinational circuits 1 and 2 is taken in the flip-flop circuits to retrieve the test results for determination in this manner is possible. However, when the control signal b of the selector 42 is set on the EOR 44 side, the exclusive-OR outputs of the entire outputs of the combinational circuit 1 can be outputted from a scan chain output terminal 45 equivalently. That is, the results are outputted to the scan chain output terminal 45 without applying clocks to the flip-flop circuits for shift operations.

In this operation, the test pattern is applied from a scan input terminal 48, and the control signal b is set on the EOR 44 side. The signal of the scan output terminal 45 is varied. Thereby, it can be detected that any one of a plurality of output signals outputted from the combinational circuit 1 has been changed by the aforesaid leakage resistance. That is, the supply voltage VDD and the substrate voltages VSB and VDB are controlled to allow the short-circuited resistance to be detected easily. Then, when the scan chain output terminal 45 is inverted before the voltage is dropped to the limit voltage that the circuits operate, a failure is to be detected.

The chained circuits using the EORS are transmitted with signals corresponding to coincidence/non-coincidence of the front stage outputs with the output signals of the combinational circuits sequentially, stabilizing in a logic state. In such chained circuits using a plurality of EORS, when one of a plurality of signals outputted from the combinational circuits is changed, the output signal of the corresponding EOR 44 is inverted. This inversion is transmitted to the EORs constituting the subsequent chained circuits, the inversions occur one by one and the scan chain output terminal 45 is inverted as described above. Under an operating condition, when an even number of signals are changed at the same time, the inversion of the inversion occurs and thus the scan chain output terminal 45 remains as it is.

However, among a plurality of logic circuits formed in the combinational circuits, the probability that signals are inverted by full voltage conditions is low. Thus, the problem described above is considered to be few. That is, because the resistance value of the leakage resistance is generated by fabrication failure, the probability of generating an even number of leakage failures having the same leakage resistance value is low. Therefore, it is considered that it is unlikely to fail to detect failures by that.

As described above, even though there is an even number of leakage failures as described above, the probability of having the same leakage resistance value is extremely low. Thus, the operating condition to increase the ON resistance value of the MOSFETs is conducted so that the supply voltage or substrate bias voltage is gradually varied from the normal operating state to increase the ON resistance values of the PMOS and the NMOS little by little, not switching the normal operating state to the lower limit voltage mentioned above. The supply voltage, the substrate bias voltage or the combination of both is recorded at the time when the scan chain output terminal 45 is changed and a rough leakage resistance value can be estimated from the recorded result.

Figure 4:
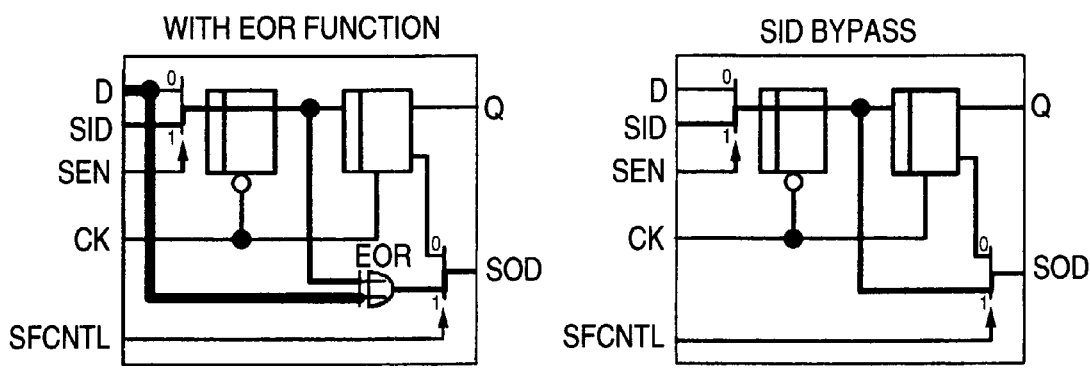
FIG. 4 depicts circuit diagrams illustrating one embodiment of flip-flop circuits used in the invention.

FIG. 4 depicts circuit diagrams illustrating one embodiment of flip-flop circuits used for the invention. The same drawing depicts two examples of flip-flop circuits, a flip-flop circuit with the EOR function and a flip-flop circuit with the SID bypass function. The flip-flop circuit with the EOR function in the embodiment corresponds to the flip-flop circuit used for the embodiment shown in FIG. 3, which incorporates the EOR 44 and the selector 42 shown in FIG. 3.

A control signal SEN controls the selector on the input side and a control signal SFCNTL controls the selector on the output side. An output signal D from the combinational circuit is directly fed to one input of the exclusive-OR EOR. When testing, the selector on the input side is set to the control signal SEN=1, an input signal (scan in data) SID from the front stage circuit is passed through the input side latch circuit to feed it to the other input of the exclusive-OR EOR. The output signal of the exclusive-OR EOR is outputted as an output signal (scan out data) SOD, setting the control signal SFCNTL=1.

In the embodiment, the above-mentioned exclusive-OR EOR is omitted and the flip-flop circuit for bypassing the input signal (scan in data) SID is also disposed. That is, in the combinational circuit, the leakage resistance failure detection is omitted for those having the extremely few number of the logic gate circuits contained in the signal-transmitting path and considered to have the extremely low probability of the leakage resistance generation. Thereby, the simplicity of the testing circuit can be intended. That is, when the flip-flop circuits equipped with the exclusive-OR circuit described above are provided for the entire signals outputted from the combinational circuit, the circuit scale is increased by that amount. Then, the output side selector is controlled by the control signal SFCNTL=1, the input side latch is passed through and the input signal SID is outputted as the output signal SOD as it is. The flip-flop circuits having the SID bypass configuration as described above are properly combined and thereby the simplicity of the circuits can be intended.

For those conducting scan in and scan out by the flip-flop circuits without using the exclusive-OR circuit EOR as shown in FIG. 1, those omitting the output side selector in the flip-flop circuit having the SID bypass configuration shown in FIG. 4 may be used. That is, the selector controlled by the signal SFCNTL is omitted and the output terminal of the output side latch circuit is directly transmitted to a scan terminal SOD. That is, the control signal SEN (scan enable) signal controls the selector, and change of a clock CK to a high level when SEN=1 takes the SID (scan in data) in the input side latch of the flip-flop circuit. Change of the clock CK from a low to a high level when SEN=0 takes the output signal D (logic data) from the combinational circuit in the input side latch.

Figure 5:
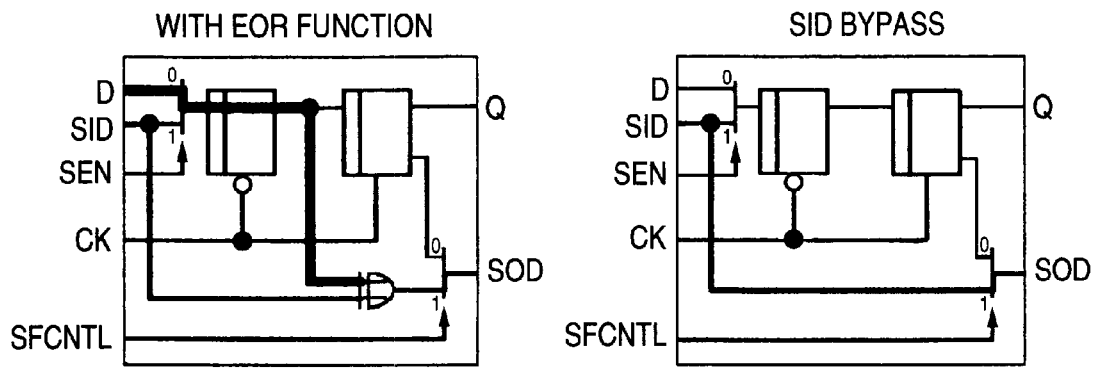
FIG. 5 depicts circuit diagrams illustrating another embodiment of the flip-flop circuits used in the invention.

FIG. 5 depicts circuit diagrams illustrating another embodiment of the flip-flop circuits used for the invention. The same drawing depicts two examples of the flip-flop circuits, the flip-flop circuit with the EOR function and the flip-flop circuit with the SID bypass function, as similar to FIG. 4. The flip-flop circuit with the EOR function in the embodiment corresponds to the flip-flop circuit used in the embodiment shown in FIG. 3, which incorporates the EOR 44 and the selector 42 shown in FIG. 3.

In the embodiment, in reverse to the embodiment shown in FIG. 4, the scan in data SID from the front stage circuit is directly fed to one input of the exclusive-OR circuit EOR. When testing, the input side selector is set to the control signal SEN=0, the logic data D from the combinational circuit is passed through the input side latch circuit and is fed to the other input of the exclusive-OR circuit EOR. The output signal of the exclusive-OR circuit EOR is outputted as the scan out data SOD, setting the control signal SFCNTL=1.

In the embodiment, the flip-flop circuit for bypassing the input signal (scan in data) SID is also disposed, omitting the exclusive-OR circuit described above. That is, the control signal SFCNTL=1 allows the output side selector to select the input signal SID and to output it as the output signal SOD. The flip-flop circuit having such an SID bypass configuration is combined with the flip-flop circuit with the EOR function and thereby the simplicity of the circuits can be intended.

Figure 6:
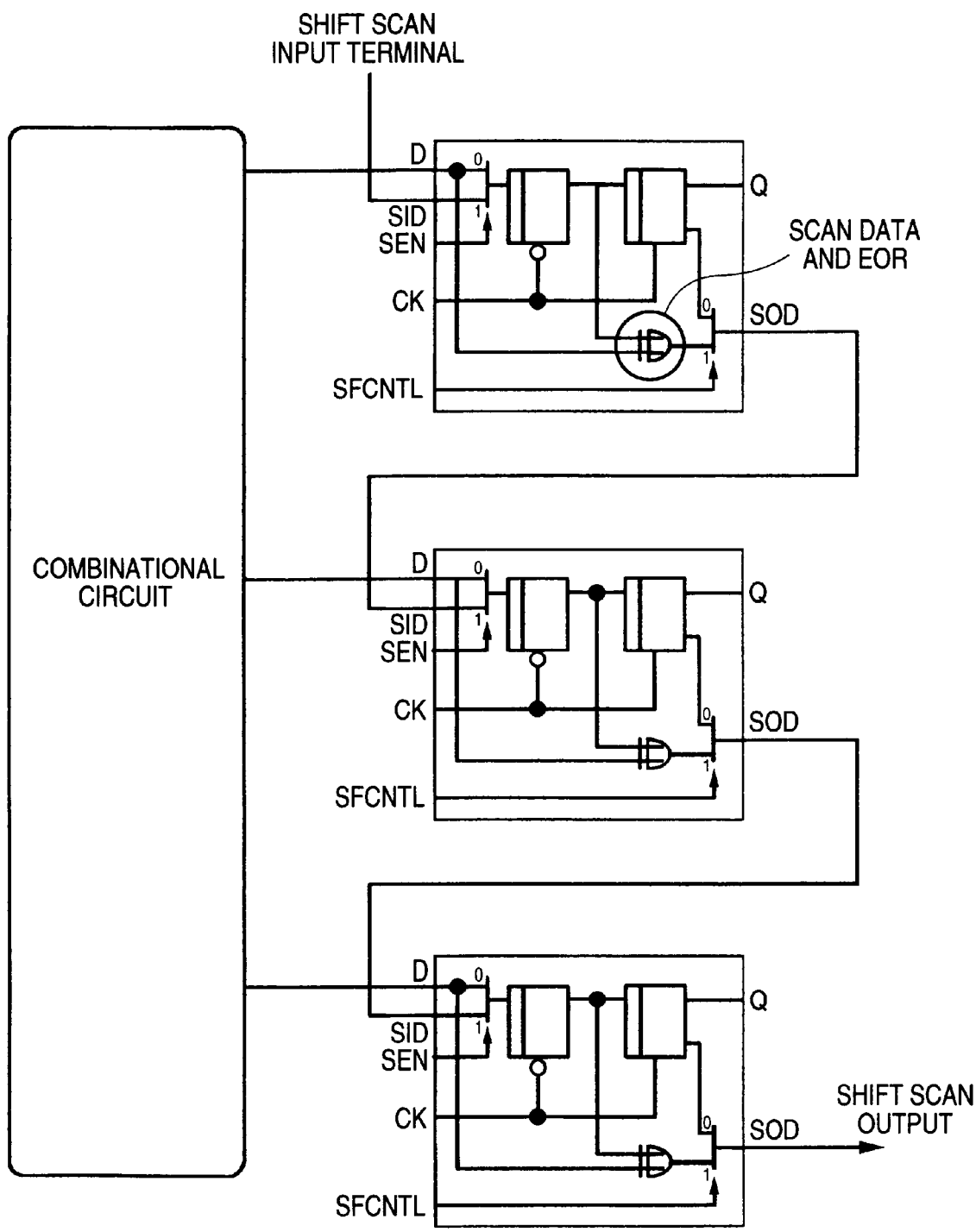
FIG. 6 depicts a schematic block diagram illustrating another embodiment of the semiconductor device applied to the manufacturing method of the semiconductor device in the invention.

FIG. 6 depicts a schematic block diagram illustrating another embodiment of the semiconductor device applied to the manufacturing method of the semiconductor device in the invention. This embodiment is configured substantially the same as the embodiment shown in FIG. 3. That is, the entire flip-flop circuits are configured to be the scan chain with the flip-flop circuits with the EOR function as shown in FIG. 4. The flip-flop circuits with the EOR function may be replaced by that shown in FIG. 5. The control signal a of the selector in the embodiment shown in FIG. 3 is equivalent to the SEN in the same drawing, and the control signal b is equivalent to the SFCNTL in the same drawing.

Figure 7:
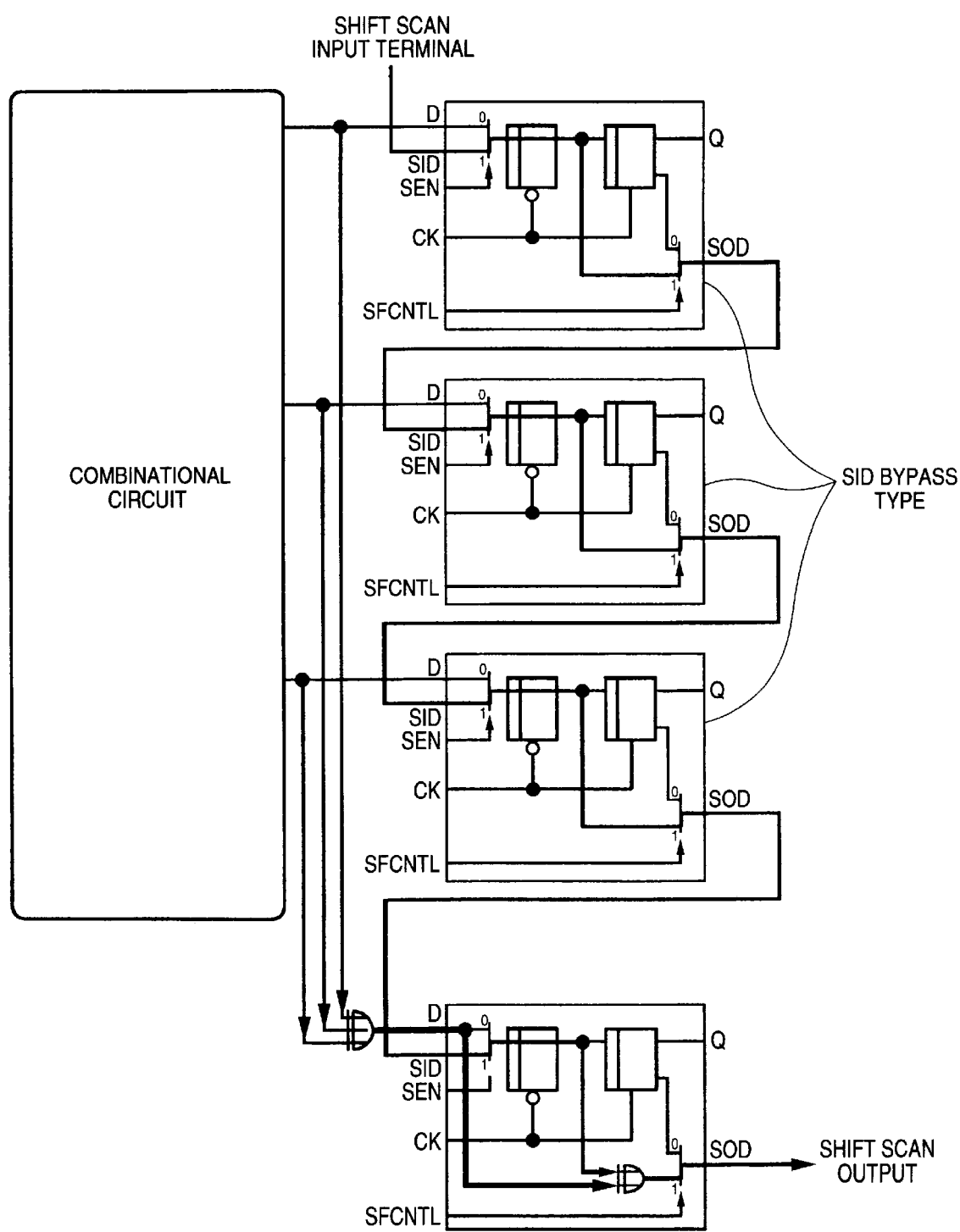
FIG. 7 depicts a schematic block diagram illustrating still another embodiment of the semiconductor device applied to the manufacturing method of the semiconductor device in the invention.

FIG. 7 depicts a schematic block diagram illustrating still another embodiment of the semiconductor device applied to the manufacturing method of the semiconductor device in the invention. The same drawing depicts an example using two flip-flop circuits, the flip-flop circuit with the EOR function and the flip-flop circuits with the SID bypass function. The flip-flop circuit with the EOR function in the embodiment corresponds to the flip-flop circuit used for the embodiments shown in FIGS. 4 and 5, which incorporates the EOR 44 and the selector 42 shown in FIG. 3.

In the embodiment, the SID bypass flip-flop circuits for decreasing overhead of an area increase in the EOR circuit are properly used. At this time, failure information of the combinational circuit corresponding to the SID bypass flip-flop circuits is not transmitted to the subsequent stage scan and thus the detection rate is decreased. Because of this, when the SID bypass flip-flop circuits are used, the entire input data D of the SID bypass flip-flop circuits is connected to the input data of the flip-flop circuit with the EOR, taking the EOR. Thereby, the failure information of the SID flip-flop circuits can be transmitted.

Figure 8:
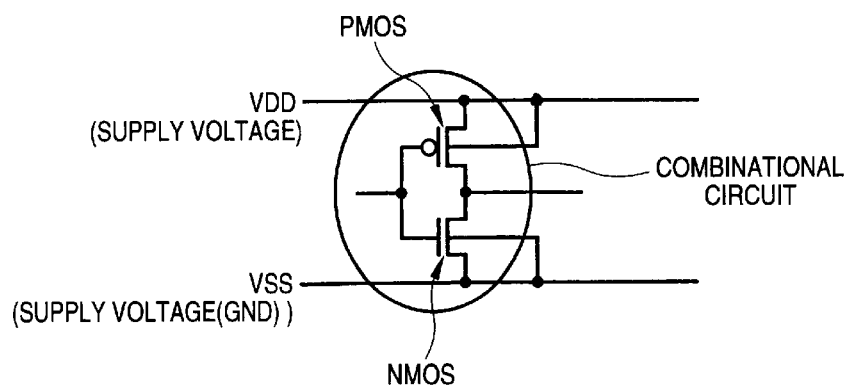
FIG. 8 depicts a circuit diagram showing one embodiment of a combinational circuit for illustrating the semiconductor device applied to the manufacturing method of the semiconductor device in the invention.

FIG. 8 depicts a circuit diagram showing one embodiment of a combinational circuit for illustrating the semiconductor device applied to the manufacturing method of the semiconductor device in the invention. The combinational circuit of the embodiment exemplifies an inverter circuit that is the most basic circuit. The inverter circuit of the embodiment is made of the PMOS and the NMOS, the substrate gate (a substrate or well region) of these is given the supply voltage VDD and the earth potential VSS. That is, both the PMOS and the NMOS are the circuits that cannot control the substrate voltage.

When the leakage resistance testing operation where the ON resistances of the PMOS and the NMOS are increased is conducted with respect to such logic circuits that cannot control the substrate voltage, the supply voltage VDD is dropped for testing. In the testing operation, for the semiconductor device equipped with the testing circuit having the exclusive-OR circuits formed in the chained configuration as described above, the supply voltage VDD is gradually dropped to the lower limit operating voltage of the logic circuits, not abruptly switching it from the power in normal operation to a predetermined test voltage. When a plurality of those having different leakage resistance values exists, the failure information can be outputted one by one in the order of those having smaller leakage resistance values, in accordance with the change in the supply voltage VDD in this manner.

Figure 9:
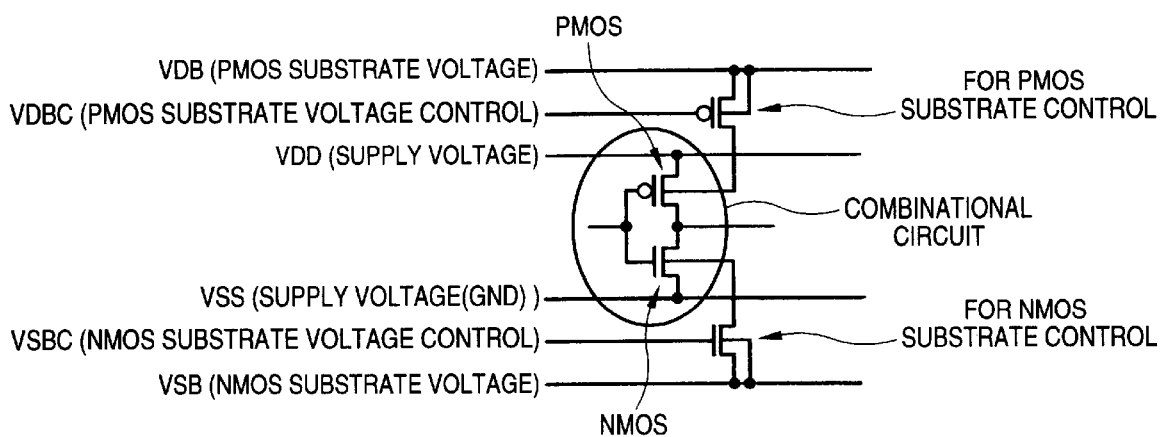
FIG. 9 depicts a circuit diagram showing another embodiment of the combinational circuit for illustrating the semiconductor device applied to the manufacturing method of the semiconductor device in the invention.

FIG. 9 depicts a circuit diagram showing another embodiment of a combinational circuit for illustrating the semiconductor device applied to the manufacturing method of the semiconductor device in the invention. In the embodiment, a switch MOSFET is disposed between the supply voltage and the substrate voltage for decreasing the leakage current of the MOSFETs in normal operation. When normal operation, the switch MOSFETs are set in the ON state as VSB=VSS and VDB=VDD, which are operated as similar to the circuit of the embodiment shown in FIG. 8.

The switch MOSFETs for controlling the substrate voltages of the embodiment may be added for a test to decrease the leakage current such as the IDD quiescent test and burn-in test. However, some of them are originally added for decreasing power consumption of the semiconductor device and thus they can be utilized. When the substrate voltage is controlled, the switch MOSFETs for controlling the substrate voltage are set in the ON state and the supply voltage and the substrate voltage are separately controlled for testing. Also, in this case, the voltages are varied step by step.

When a plurality of those having different leakage resistance values exists, the failure information can be outputted one by one in the order of those having smaller leakage resistance values, in accordance with the change in the supply voltage VDD in this manner.

In the embodiments described earlier, the semiconductor device, in which the coincidence/non-coincidence circuits such as exclusive-OR circuits are formed into the chained configuration and the failure information due to the leakage resistance can be outputted outside without having the output of the combinational circuit passed through the flip-flop circuits, can determine the existence of the leakage resistance without feeding clocks. When the clocks are fed, the output signals of the logic circuits are changed correspondingly to them to generate noises in a power supply line or earthing wire. Therefore, those detecting a voltage level corresponding to the leakage resistance and the ON resistance of the MOSFETs by the logic threshold of the subsequent logic circuit are subject to the influence of the noises mentioned above.

Accordingly, the configuration using the coincidence/non-coincidence circuits as described above can detect the existence of the leakage resistance highly accurately with no clock feeding. The leakage resistance is not generated between the signal-transmitting path and the power supply line, as shown by the circuit diagrams in FIGS. 2A and 2B. However, in many cases, insulation failure between the gate and the source of the MOSFET is considered to cause it. Such insulation failure between the gate and the source is accelerated over time. Even though it may not cause a problem at the time of shipment, the probability of causing failure is extremely high due to repeated operations of the ON and the OFF states of the MOSFET.

The IDD quiescent test is a test that simply measures a current flowing between the supply voltage and the earth potential of the circuit, which detects failures as IDD quiescent failures, as long as a plurality of leakage resistance described above exists. Therefore, when seen as the leakage current in the semiconductor device, those not being distinguished from a subthreshold leakage current flowing through the MOSFET in the OFF state or a tailing current cannot be detected. On the other hand, the testing method in the invention can detect it even though one point of leakage exists, which can realize the high reliability of the semiconductor device.

Dimension down-scaling of the elements of the semiconductor device brings the high integration of the circuits, or the subthreshold leakage current or tailing current tends to increase more and more due to the realization of high speed. In the invention, the leakage resistance can be detected accurately, independent of discrete subthreshold leakage currents or tailing currents. Therefore, it is not only a merely alternative testing technique for the semiconductor devices that the IDD quiescent test cannot be conducted but also a novel testing method indispensable for technical development aiming the realization of high integration or high speed in the semiconductor devices, which is considerably meaningful, because it can eliminate oncoming element failures as described above.

That is, the entire logics are substantially connected by the EORs; the internal conditions can be observed without scan operation. When the signal path is short-circuited with the power source at high resistance, it is possible that narrowing the power supply or controlling the substrate voltage of the MOSFET increases the ON resistance of the MOSFET to change the potential of the signal path that is short-circuited with the power source, and the output value of the subsequent circuit is inverted to compulsorily make it out a direct currant failure. The output end of the shift chain is observed and thereby it is possible to accurately detect not only failures that are detected by the IDD quiescent test but also failures that cannot be detected by the IDD quiescent test. Additionally, currents are not measured and thus the reduced tasting time is also possible.

Figure 10:
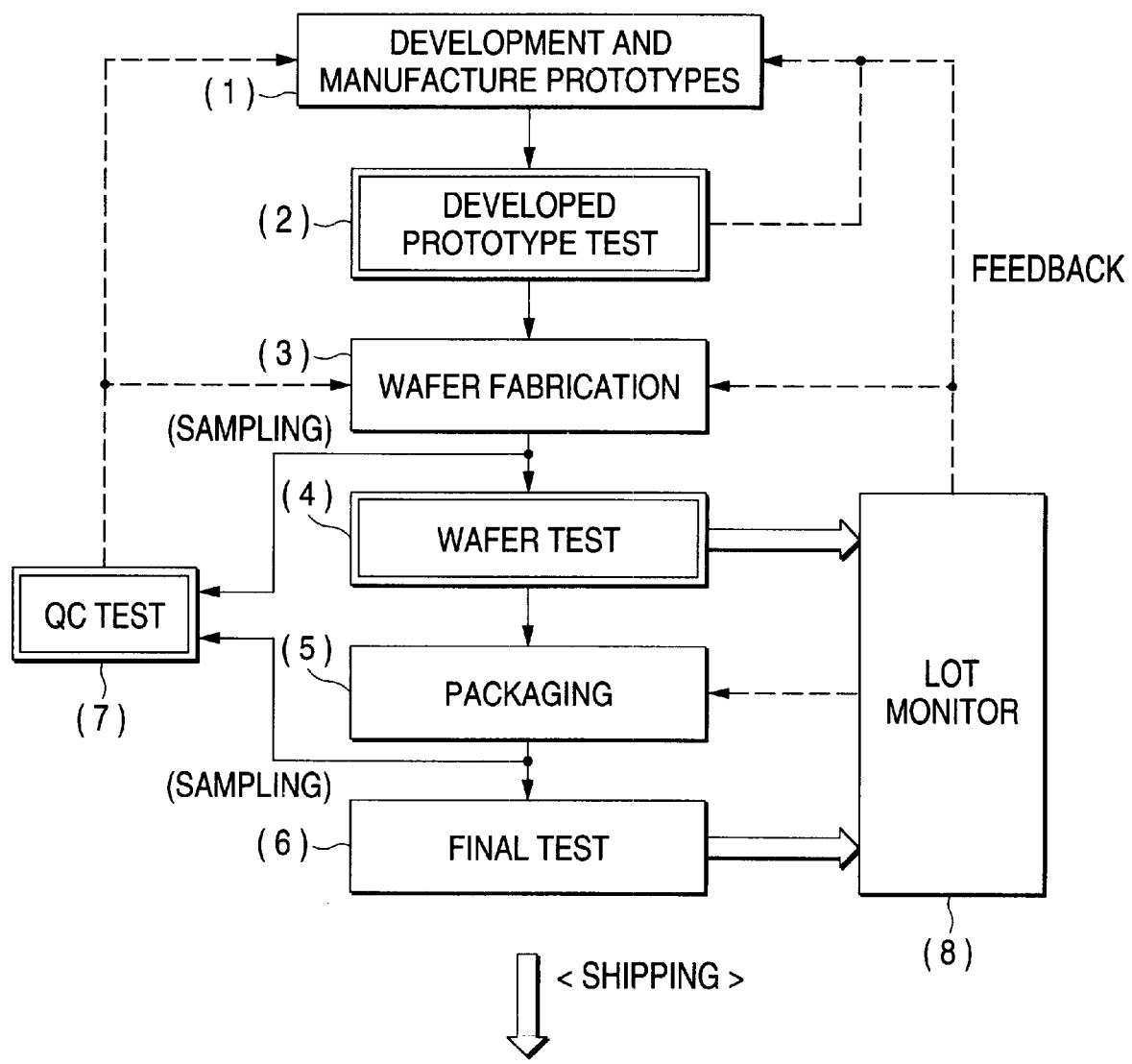
FIG. 10 depicts a schematic flowchart illustrating one embodiment of the manufacturing method of the semiconductor device in the invention.

FIG. 10 depicts a schematic flowchart illustrating one embodiment of the manufacturing method of the semiconductor device in the invention. To the semiconductor device formed at step 1 of developing and manufacturing prototypes, a developed prototype testing is conducted at step 2. That is, at step 1, models are set to conduct functional design, logic design, circuit design and mask design by using a computer.

The developed prototype testing at step 2 at the stage of developing and manufacturing prototypes, the distributions of various parameters and environmental safety are confirmed on many prototype samples. In the developed prototype testing, the prototyped semiconductor device has the testing circuit by the scan path method as the embodiments. Thus, performing the leakage resistance testing described above can find leakage resistances that cannot be determined by the IDD quiescent test. When they are caused by layout, they can be improved at the stage of developing and manufacturing prototypes.

By way of steps 1 and 2, at step 3, the wafer production is conducted for aiming mass production. To the semiconductor devices completed on the wafer by the mass production, the alternating current testing or direct current testing using the testing circuit of the scan path method is conducted in the wafer testing at step 4. In the testing, the leakage resistance testing described above is performed by utilizing the testing circuit by the scan path method as the embodiments described above and thereby leakage resistances can be detected, which cannot be detected by the IDD quiescent test, even though the IDD quiescent test can be conducted, other than the direct current testing as the alternative of the IDD quiescent test.

After the wafer testing, assembly of packaging is conducted at step 5. To the semiconductor devices thus completing their assembly, the final testing is performed at step 6. The final testing includes the burn-in test (high temperature running test) for extracting initial failures of the semiconductor devices. The leakage resistance testing mentioned above is performed by utilizing the testing circuit by the scan path method as the embodiments and thereby leakage resistances can be detected, which cannot be detected by the IDD quiescent test, even though the IDD quiescent test can be conducted, other than the direct current testing as the alternative of the IDD quiescent test.

Step 7 is the QC (quality control) test where samples are extracted from lots and the test results are held for a long time. On the test items, each of the characteristics is strictly examined, not the results of determining whether is good or bad in the wafer test at step 4. In the QC test, when the leakage resistance testing is performed, the criteria of determining whether is good or bad by the leakage resistance testing can be enhanced by the comparison of oncoming failures. Test results at steps 4 and 6 are sent to a lot monitor 8, deficiency in each of the processes is estimated from data done by category classification for feedback and thereby improvement in the yields is intended.

The working effects obtained from the embodiments are as follows.

(1) During processes after a desired circuit including a CMOS static type circuit is formed on a semiconductor substrate until product shipment, a first operation of feeding a predetermined input signal to the circuit and retrieving a first output signal corresponding to it and a second operation of giving an operating condition of increasing an ON resistance value of MOSFETs constituting the CMOS static type circuit and retrieving a second output signal corresponding to the condition are conducted, and a testing step of determining a failure by the first output signal varying from the second signal is provided. Thereby, the effect can be obtained in which the highly reliable semiconductor device can be fabricated with the realization of high integration or high speed intended.

(2) In addition to that, as the desired circuit including the CMOS static type circuit, a first combinational circuit for receiving an input signal fed from an external terminal or input signals from other flip-flop circuits to form a plurality of output signals and a plurality of first flipflop circuits for receiving the plurality of output signals of the first combinational circuit are formed into a chained configuration, and an operation of serially retrieving input signals corresponding to a plurality of input signals to be fed to a second combinational circuit, retrieving the output signals of the first combinational circuit to serially output them and an operation of giving an operating condition of increasing an ON resistance value of MOSFETs and retrieving output signals to serially output them are conducted. Thereby, the effect can be obtained in which the highly reliable semiconductor device can be fabricated as utilizing the testing circuit by the scan path method.

(3) In addition to that, as the CMOS static type circuit, a bias circuit for applying back bias to a substrate where MOSFETs are formed or between a well region and a source is provided, and an operating condition of increasing a back bias voltage in its absolute value greater than that in normal operation is added to the operating condition of increasing the ON resistance value of the MOSFETS. Thereby, the effects can be obtained in which leakage resistance failures can be detected highly accurately and highly reliable semiconductor device can be fabricated.

(4) In addition to that, as the desired circuit including the CMOS static type circuit, a first combinational circuit for receiving an input signal fed from an external terminal or input signals from other flip-flop circuits to form a plurality of output signals and a plurality of first flip-flop circuits for receiving the plurality of output signals of the first combinational circuit are formed into a chained configuration, each of the plurality of first flip-flop circuits is provided with a coincidence/non-coincidence circuit, each of the plurality of first flip-flop circuits conducts an operation of serially retrieving input signals corresponding to a plurality of input signals fed to the second combinational circuit when the first operation, and using the coincidence/non-coincidence circuits when the second operation to output the output signals to a subsequent stage circuit, the output signals corresponding to coincidence/non-coincidence with the output signals of the coincidence/non-coincidence circuits corresponding to a front stage circuit of the first flip-flop circuits serially connected to second output signals of the first combinational circuit. Thereby, the effect can be obtained in which the highly reliable semiconductor device can be fabricated as utilizing the testing circuit by the scan path method.

(5) In addition to that, to the operating condition of increasing the ON resistance value of the MOSFETs when the second operation, a condition of reducing the supply voltage lower than that in normal operation is included. Thereby, the effect can be obtained in which various semiconductor devices that do not include combinational circuits having no substrate back bias feeding unit can be fabricated with high reliability.

(6) In addition to that, as the CMOS static type circuit, a bias circuit for applying back bias to a substrate where MOSFETs are formed or between a well region and a source is provided, the operating condition of increasing the ON resistance value of the MOSFETs when the second operation is to be the condition of increasing the back bias voltage in its absolute value greater than that in normal operation. Thereby, the effects can be obtained in which leakage resistance failures can be detected highly accurately and highly reliable semiconductor device can be fabricated.

(7) In addition to that, clock signals fed to the first flip-flop circuits are stopped when the second operation. Thereby, logic outputs are not inverted by noises. Therefore, the effects can be obtained in which leakage resistance failures can be detected highly accurately and highly reliable semiconductor device can be fabricated.

(8) In addition to that, as the plurality of first flip-flop circuits, it is constituted of those including first and second latch circuits and the coincidence/non-coincidence circuit and those including no coincidence/non-coincidence circuit. Thereby, the effect can be obtained in which the semiconductor devices combining both high integration and high reliability can be fabricated in accordance with the combinational circuits.

As described above, the invention done by the inventors has been described specifically in accordance with the embodiments, but the invention is not limited to the embodiments. It is needless to say that a variety of modifications are possible. without deviating the scope of the invention. For example, the circuit retrieving the internal signals in the first and second operations can adopt various embodiments such as using gate circuits, in addition to the scan path method. However, the scan path method can be used for both the serial input of the test pattern and the serial output of the internal signals corresponding to the test pattern. Therefore, a utilization ratio of circuits is high and consequently the circuits are formed highly integrated.

The testing circuit by the scan path method was configured in which the combinational circuits are divided into plurals and serial input terminals and serial output terminals are disposed corresponding to each of the combinational circuits. However, the flip-flop circuits may be connected to a plurality of combinational circuits in the chained configuration. That is, the flip-flop circuits formed in the chained configuration may be divided into plural groups, corresponding to input/output terminals accepted to the semiconductor device. The invention can be applied to various methods for fabricating semiconductor devices, as the manufacturing method of the semiconductor device capable of detecting leakage resistance failures in the CMOS circuits and the testing method.

The effects obtained by the representative invention among the inventions disclosed in the application will be explained briefly as follows. During processes after a desired circuit including a CMOS static type circuit is formed on a semiconductor substrate until product shipment, a first operation of feeding a predetermined input signal to the circuit and retrieving a first output signal corresponding to it and a second operation of giving an operating condition of increasing an ON resistance value of MOSFETs constituting the CMOS static type circuit and retrieving a second output signal corresponding to the condition are conducted, and a testing step of determining a failure by the first output signal varying from the second output signal is provided. Thereby, the highly reliable semiconductor device can be fabricated with the realization of high integration and high speed intended.

What is claimed is:

1. A manufacturing method of a semiconductor device comprising:

during processes after a desired circuit including a CMOS static type circuit being formed on a semiconductor substrate until product shipment, a first operation of feeding a predetermined input signal and retrieving a first output signal corresponding to it;

a second operation of giving an operating condition of increasing an ON resistance value of MOSFETs constituting the CMOS static type circuit and retrieving a second output signal corresponding to the condition; and a testing step of determining a failure by the first output signal in the first operation varying from the second output signal in the second operation.

2. The manufacturing method of the semiconductor device according to claim 1, wherein the desired circuit including the CMOS static type circuit includes:

a first combinational circuit for receiving an input signal fed from an external terminal or input signals from other flip-flop circuits to form a plurality of output signals;

a plurality of first flip-flop circuits for receiving the plurality of output signals of the first combinational circuit; and a second combinational circuit for receiving output signals of the plurality of first flip-flop circuits, wherein each of the plurality of first flip-flop circuits comprises first and second latch circuits, which conducts an operation of serially connecting the first and second latch circuits when the first operation to serially retrieve input signals corresponding to a plurality of input signals fed to the second combinational circuit to hold them in the second latch circuit, and allowing the first latch to retrieve a first output signal of the first combinational circuit to serially output it, and an operation of retrieving a second output signal of the first combinational circuit when the second operation to serially output it.

3. The manufacturing method of the semiconductor device according to claim 2, wherein the CMOS static type circuit comprises a bias circuit for applying back bias to a substrate where MOSFETs are formed or between a well region and a source, and a condition of increasing the back bias voltage in its absolute value greater than that in normal operation is included as an operating condition of increasing an ON resistance value of MOSFETs when the second operation.

4. The manufacturing method of the semiconductor device according to claim 1, wherein the desired circuit including the CMOS static type circuit includes:

a first combinational circuit for receiving an input signal fed from an external terminal or input signals from other flip-flop circuits to form a plurality of output signals;

a plurality of first flip-flop circuits for receiving the plurality of output signals of the first combinational circuit; and a second combinational circuit for receiving output signals of the plurality of first flip-flop circuits, wherein each of the plurality of first flip-flop circuits comprises first and second latch circuits and a coincidence/non-coincidence circuit, which conducts an operation of serially connecting the first and second latch circuits when the first operation to serially retrieve input signals corresponding to a plurality of input signals fed to the second combinational circuit to hold them in the second latch circuit and using the coincidence/non-coincidence circuit when the second operation to output an output signal to a subsequent stage circuit, the output signal corresponding to coincidence/non-coincidence with output signal of the coincidence/non-coincidence circuit corresponding to a front stage circuit of the first flip-flop circuits serially connected to a second output signal of the first combinational circuit.

5. The manufacturing method of the semiconductor device according to claim 4, wherein an operating condition of increasing an ON resistance value of MOSFETs when the second operation includes a condition of reducing a supply voltage lower than that in normal operation.

6. The manufacturing method of the semiconductor device according to claim 5, wherein the CMOS static type circuit comprises a bias circuit for applying back bias to a substrate where MOSFETs are formed or between a well region and a source, and an operating condition of increasing the ON resistance value of the MOSFETs when the second operation includes a condition of increasing the back bias voltage in its absolute value greater then that in normal operation.

7. The manufacturing method of the semiconductor device according to claim 5, wherein clock signals to be fed to the first flip-flop circuits are stopped when the second operation.

8. The manufacturing method of the semiconductor device according to claim 5, wherein the plurality of first flip-flop circuits comprises those including first and second latch circuits and a coincidence/non-coincidence circuit, which conducts an operation of serially connecting the first and second latch circuits when the first operation to serially retrieve input signals corresponding to a plurality of input signals fed to the second combinational circuit to hold them in the second latch circuit, using those including the coincidence/non-coincidence circuit when the second operation to output an output signal to a subsequent stage circuit, the output signal corresponding to coincidence/non-coincidence with an output signal of coincidence/non-coincidence circuit corresponding to a front stage circuit of the first flip-flop circuits serially connected to a second output signal of the first combinational circuit, and allowing those not including the coincidence/non-coincidence circuit to transmit an output signal of the front stage circuit of the first flip-flop circuits serially connected as it is.

9. The manufacturing method of the semiconductor device according to claim 4, wherein the CMOS static type circuit comprises a bias circuit for applying back bias to a substrate where MOSFETs are formed or between a well region and a source, and an operating condition of increasing the ON resistance value of the MOSFETs when the second operation includes a condition of increasing the back bias voltage in its absolute value greater then that in normal operation.

10. The manufacturing method of the semiconductor device according to claim 4, wherein clock signals to be fed to the first flip-flop circuits are stopped when the second operation.

11. The manufacturing method of the semiconductor device according to claim 4, wherein the plurality of first flip-flop circuits comprises those including first and second latch circuits and a coincidence/non-coincidence circuit, which conducts an operation of serially connecting the first and second latch circuits when the first operation to serially retrieve input signals corresponding to a plurality of input signals fed to the second combinational circuit to hold them in the second latch circuit, using those including the coincidence/non-coincidence circuit when the second operation to output an output signal to a subsequent stage circuit, the output signal corresponding to coincidence/non-coincidence with an output signal of coincidence/non-coincidence circuit corresponding to a front stage circuit of the first flip-flop circuits serially connected to a second output signal of the first combinational circuit, and allowing those not including the coincidence/non-coincidence circuit to transmit an output signal of the front stage circuit of the first flip-flop circuits serially connected as it is.

12. A manufacturing method of a semiconductor device comprising a power supply terminal, a P-channel type MOSFET and an N-channel type MOSFET, the manufacturing method of the semiconductor device comprising:
connecting the power supply terminal to a source of the P-channel type MOSFET to form a circuit connecting a drain of the P-channel type MOSFET to a drain of the N-channel type MOSFET and a gate of the P-channel type MOSFET to a gate of the N-channel type MOSFET on a semiconductor substrate;
obtaining a first output signal corresponding to an input signal fed to the gates from the drains when a supply voltage of the power supply terminal is at a first voltage level;
obtaining a second output signal corresponding to an input signal fed to the gates from the drains when the supply voltage of the power supply terminal is at a second voltage level lower than the first voltage level and a MOSFET ON resistance value is changed; and
determining whether the semiconductor device is good or bad by comparing the first output signal with the second output signal.

13. A manufactnring method of a semiconductor device comprising a P-channel type MOSFET and an N-channel type MOSFET, the manufacturing method of the semiconductor device comprising:
forming a circuit connecting a drain of the P-channel type MOSFET to a drain of the N-channel type MOSFET and a gate of the P-channel type MOSFET to a gate of the N-channel type MOSFET on a semiconductor substrate;
obtaining a first output signal corresponding to an input signal fed to the gates from the drains;
giving an operating condition for changing an ON resistance value of the P-channel type MOSFET or the N-channel type MOSFET;
obtaining second output signal corresponding to an input signal ted to the gates under the operating condition; and
determining acceptability of the semiconductor device by comparing the first output signal with the second output signal.

14. A manufacturing method of a semiconductor device comprising:
operating a circuit in a first test operation such that said circuit receives a first input signal and outputting a first output signal corresponding to said first input signal, an ON resistance value of MOSFETs in said circuit being a first value; and
operating said circuit in a second test operation such that said circuit receives a second input signal and outputting a second output signal corresponding to said second input signal, an ON resistance value of MOSFETs in said circuit being a second value which is a larger than said first value in order to detect a leakage current failure of said circuit.

15. A manufacturing method of a semiconductor according to claim 14,
wherein a substrate bias voltage of said circuit is controlled in order to change said ON resistance value of MOSFETs in said circuit.

16. A manufacturing method of a semiconductor according to claim 14,
wherein a supply voltage of said circuit is controlled in order to change said ON resistance value of MOSFETs in said circuit.

17. A manufacturing method of a semiconductor device comprising:
during processes after a desired circuit including a CMOS static type circuit being formed on a semiconductor substrate until product shipment,
operating said desired circuit in a first operation such that said desired circuit receives an input signal and outputting a first output signal corresponding to said input signal, an ON resistance value of MOSFETS in said CMOS static type circuit being a first value in said first operation;
operating said desired circuit in a second operation such that said desired circuit receives said input signal and outputting a second output signal corresponding to said input signal, an ON resistance value of MOSFETs in said CMOS static type circuit being a second value which is larger than said first value in said second operation; and
comparing said first output signal and said second output signal for determining a failure of said desired circuit.

* * * * *